United States Patent [19]

Radovsky

[11] Patent Number: 4,686,487
[45] Date of Patent: Aug. 11, 1987

[54] CURRENT MIRROR AMPLIFIER

[75] Inventor: Jonathan S. Radovsky, Minneapolis, Minn.

[73] Assignee: Commodore Business Machines, Inc., West Chester, Pa.

[21] Appl. No.: 889,838

[22] Filed: Jul. 28, 1986

[51] Int. Cl.$^4$ ............................................. H03F 3/04
[52] U.S. Cl. .................................................. 330/288
[58] Field of Search ............... 330/288, 257; 323/315, 323/316

[56] References Cited

U.S. PATENT DOCUMENTS

| T953,012 | 12/1976 | Radovsky | 330/288 |
|---|---|---|---|
| 3,852,679 | 12/1974 | Schade, Jr. | 330/288 |
| 3,939,434 | 2/1976 | Crosby | 330/288 |
| 3,992,676 | 11/1976 | Knight | 330/288 |
| 4,100,436 | 7/1978 | van de Plassche | 330/288 |
| 4,334,198 | 6/1982 | Malchow | 330/288 |
| 4,415,864 | 11/1983 | Boeke | 330/288 |
| 4,433,303 | 2/1984 | Sasaki | 330/288 |

Primary Examiner—Gene Wan
Attorney, Agent, or Firm—Finnegan, Henderson, Farabow, Garrett & Dunner

[57] ABSTRACT

A current mirror amplifier is provided wherein the feedback path around a diode-connected device is modified by adding a resistor in series with the input terminal of the diode-connected device in order to cancel a pole which appears at the unity-gain frequency. This will improve the frequency response and provide for increased bandwidth. The added resistor may be realized in MOS technology by employing a tracking MOS device.

13 Claims, 7 Drawing Figures

CURRENT MIRROR AMPLIFIER

BACKGROUND OF THE INVENTION

The present invention relates to a current mirror amplifier (CMA) with improved frequency response which is especially beneficial when implemented in CMOS technology.

A current mirror amplifier is a current amplifier with a current gain of minus unity commonly used in integrated circuitry. Current variations applied to its input circuit, which customarily exhibits relatively low impedence, will cause corresponding current variations equal and opposite thereto in its output circuit, which customarily exhibits relatively high impedence.

Current mirror amplifiers are useful in various applications. Current mirror amplifiers are often employed as active loads for differential amplifiers. They are also used in operational transconductance amplifiers (OTA's), which are becoming popular for switched-capacitor applications.

A common problem in MOS amplifiers is the presence of a low-frequency right-half plane zero. This zero is present in bipolar circuits as well, but is typically at a high frequency due to the higher transconductance of bipolar devices.

Voltage amplifier performance for alternating current (ac) operation can be estimated and designed for by inspection of the poles and zeros of the gain function, where gain=$V_{out}/V_{in}$. Poles represent the values of the complex frequency, s, at which the gain of the amplifier is theoretically infinite. Zeros represent the values of the complex frequency at which the gain of the amplifier is equal to zero. The range of usable frequency values for the operation of the amplifier is related to the bandwidth of the amplifier. The 3 dB bandwidth is the frequency at which the gain has fallen by 3 dB to approximately 70% of its low-frequency value.

When designing amplifier circuits, a technique commonly used is to substitute a small signal model of the transistor for ac analysis. (Small signals represent values at which the transistor never operates very far from its DC operating point.) At low frequencies, the capacitive reactance, looking into the gate of an MOS transistor, is so large in comparison with other impedences in the circuit that its input may be considered to be an open circuit. Therefore, MOS transistor Q7 shown in FIG. 1A, can be modelled as an ideal voltage-controlled current source with transconductance equal to $g_m$, as shown in FIG. 1B. The transconductance is:

$$g_m = i_d/v_{gs}$$

where $i_d$ is the drain current and $v_{gs}$ is the gate-to-source voltage.

When transistor Q6 is used in a current mirror circuit its gate is tied to its drain by a connecting wire 1, as shown in FIG. 1C. The small signal model for analysis of this arrangement is shown in FIG. 1D. With this connection, the input current and resistance are described by:

$$i_{in} = i_{d6}$$

and $$z_{in} = v_{in}/i_{in} = v_{gs}/i_{d6} = 1/g_{m6}.$$

An example of a prior art MOS current mirror circuit, constructed with the component circuits shown in FIGS. 1A and 1C, is shown in FIG. 2. Operational amplifiers incorporating such prior art circuits are characterized by a first stage mirror pole present in one-half of the signal path, with another pole occurring at a higher frequency in the other half of the signal path. The mirror pole frequency=$g_{m6}/2\pi(C_{g6}+C_{g7})$, where $g_{m6}$ is the transconductance associated with transistor Q6, and $C_{g6}$ and $C_{g7}$ are the gate-to-source capacitances associated with transistors Q6 and Q7, respectively. The first stage mirror pole contributes excess phase shift which degrades the stability of operational amplifiers in closed-loop applications by reducing phase margin.

SUMMARY OF THE INVENTION

It is therefore an object of the present invention to reduce the degrading effect of the mirror pole on the phase margin of operational amplifiers.

It is a further object of the present invention to increase the bandwidth of current mirror amplifier circuits.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the current mirror amplifier of this invention has an associated frequency response and comprises an input terminal for receiving an input current; first and second amplifying devices, each having an associated transconductance and a drain terminal, a source terminal, and a gate terminal, the drain terminal of the first amplifying device being connected to the input terminal of the current mirror amplifier, and the source terminal of the second amplifying device being connected to the source terminal of the first amplifying device; resistive means, having an associated value of equivalent resistance, connected between the gate terminals of the first and second amplifying devices for adjusting the frequency response of the current mirror amplifier; feedback means connected betwen the gate terminal of the second amplifying device and the input terminal of the current mirror amplifier for forcing the first amplifying device to accept the input current, and for simultaneously forcing the second amplifying device to accept an output current depending on the input current and the frequency response of the current mirror amplifier as determined by the resistive means; and an output terminal connected to the drain terminal of the second amplifying device for supplying an output current responsive to the input current.

The accompanying drawings, which are incorporated in and constitute a part of the specification, illustrate presently preferred embodiments of the invention and, together with the general description of the invention given above and the detailed description of the preferred embodiments given below, serve to explain the principles of the invention.

DESCRIPTION OF THE PREFERRED EMBODIMENT

Figure 1A:
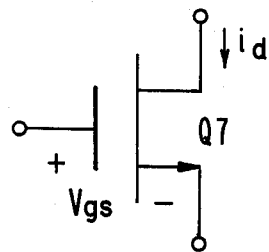
FIG. 1A is a schematic circuit diagram illustrating a MOS transistor Q7.
Figure 1B:
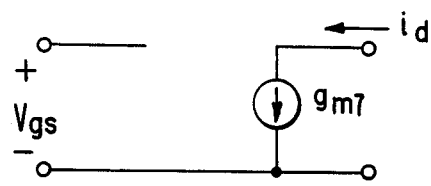
FIG. 1B is a small-signal model of MOS transistor Q7 of FIG. 1A modelled as an ideal voltage-controlled current source.
Figure 1C:
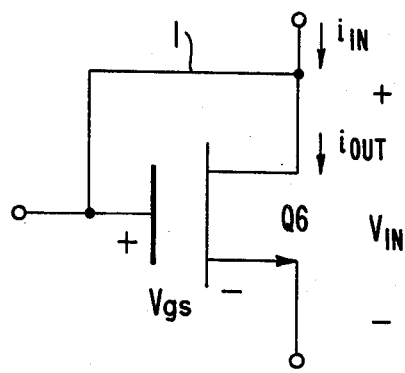
FIG. 1C is a schematic circuit diagram of a diode-connected MOS transistor Q6.
Figure 1D:
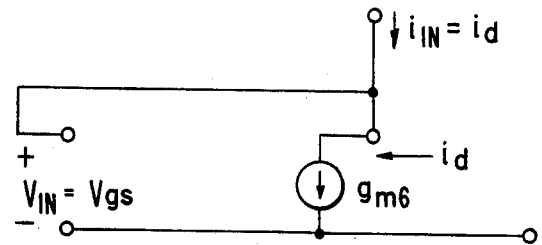
FIG. 1D is a small-signal model of diode-connected MOS transistor Q6 of FIG. 1C.
Figure 2:
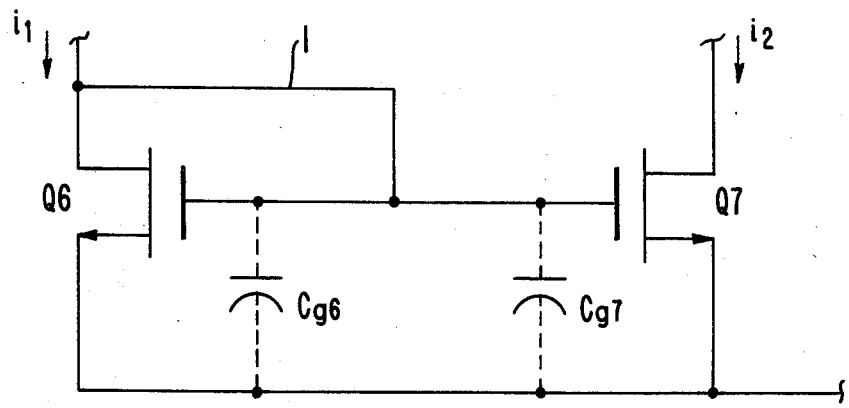
FIG. 2 is a schematic circuit diagram illustrating a prior art current mirror circuit with a mirror pole.

Reference will now be made in detail to the presently preferred embodiments of the invention, examples of which are illustrated in the accompanying drawings in which like reference characters refer to like elements.

Figure 3:
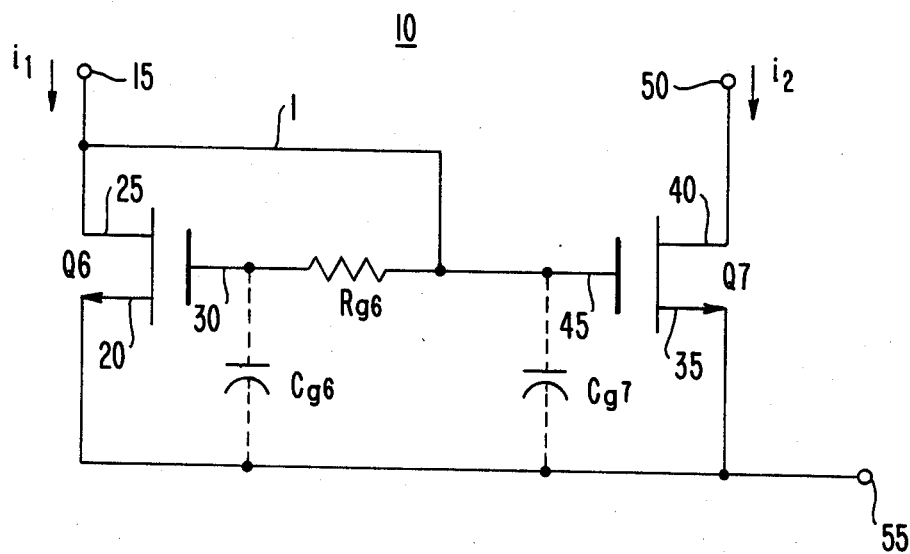
FIG. 3 is a schematic circuit diagram illustrating a current mirror with a resistor added in accordance with a preferred embodiment of the present invention.

A current mirror amplifier which constitutes a preferred embodiment of the invention is shown in FIG. 3 and is represented generally by numeral 10. Input terminal 15 is provided for receiving the input current. In accordance with the invention, first and second amplifying devices, Q6 and Q7, are provided, each having a drain terminal, a source terminal and a gate terminal and an associated transconductance. As embodied herein, the first and second amplifying devices are realized by using field-effect transistors. Drain terminal 25 of transistor Q6 is connected to input terminal 15 of the current mirror amplifier 10. Source terminal 20 of transistor Q6 is connected to source terminal 35 of transistor Q7.

In accordance with the invention, current mirror amplifier 10 also includes resistive means, having an associated value of equivalent resistance, connected between the gate terminals of the first and second amplifying devices for adjusting the frequency response of the current mirror amplifier. As embodied herein, the resistive means for adjusting the frequency response of the current mirror amplifier preferably consists of a resistor $R_{g6}$ connected in series between gate terminal 30 of transistor Q6 and gate terminal 45 of transistor Q7.

According to the present invention, current mirror amplifier 10 also includes feedback means connected between the gate terminal of the second amplifying device and the input terminal of the current mirror amplifier for forcing the first amplifying device to accept the input current, and for simultaneously forcing the second amplifying device to accept an output current depending on the input current and the frequency response of the current mirror amplifier as determined by the resistive means in conjunction with the input capacitances of the two amplifying devices incorporated in the CMA. As embodied herein, the feedback means consists of a wire connection 1 as shown in FIG. 3.

In accordance with the invention, output terminal 50 is connected to drain terminal 40 of transistor Q7 and accepts an output current responsive to the input current $i_1$. Source terminal 35 of transistor Q7 is connected to common terminal 55. Drain terminal 40 of transistor Q7 can be connected to an external circuit when current mirror amplifier 10 is used as an active load. Capacitors $C_{g6}$ and $C_{g7}$ represent the input capacitances associated with transistors Q6 and Q7, between nodes 30 and 20, and 45 and 35, respectively.

The operation of the circuit in FIG. 3 will now be explained. When resistor $R_{g6}$ is added in series with the gate of transistor Q6, a pole is created at $\omega = 1/R_{g6}C_{g6}$. This creates an additional zero, but there are also two poles in the transfer function as shown:

$$\frac{i_2}{i_1} = \frac{g_{m7}(1 + sC_{g6}R_{g6})}{g_{m6} + s(C_{g6} + C_{g7}) + s^2 C_{g6}C_{g7}R_{g6}}, \text{ where}$$

$$\omega_z = \frac{-1}{R_{g6}C_{g6}} \text{ and } \omega_p = -\frac{1}{2}\left(\frac{C_{g6} + C_{g7}}{C_{g6}C_{g7}R_{g6}}\right) \pm$$

$$\frac{1}{2}\sqrt{\left(\frac{C_{g6} + C_{g7}}{C_{g6}C_{g7}R_{g6}}\right)^2 - \left(\frac{4g_{m6}}{C_{g6}C_{g7}R_{g6}}\right)}$$

Depending on the value chosen for $R_{g6}$, the poles may be complex or real. If the value of $C_{g6} = C_{g7}$, and if one chooses $R_{g6} = 1/g_{m6}$, then the poles will be real and equal, and will be at the same frequency as the added zero. Therefore, $g_{m6} = g_{m7} = g_m$ and $C_{g6} = C_{g7} = C$. Thus, $$\frac{i_{out}(s)}{i_{in}(s)} = \frac{1 + \frac{sC}{g_m}}{\left(1 + \frac{sC}{g_m}\right)\left(1 + \frac{sC}{g_m}\right)}.$$

This formula shows that the network of FIG. 3 has one zero and a double pole at a frequency of $-g_m/C$.

Since the value for $R_{g6}$ is set equal to $1/g_m$, then the zero will cancel one pole, leaving a current mirror with a single pole response at the frequency $= g_m/2\pi C$. The original simple current mirror circuit of FIG. 1 had the pole at frequency $=$ $$\frac{g_m}{2\pi (C_{g6} + C_{g7})}.$$

The new pole is at twice the frequency of the pole in the simple current mirror of FIG. 1. As a result, when the current mirror circuit of FIG. 3 is used in an operational amplifier, the frequency response will be improved.

If the transconductances of transistors Q6 and Q7 are not equal, then the value of the equivalent resistance of the resistor $R_{g6}$ should be set equal to:

$$\frac{\left(\frac{g_{m7}}{g_{m6}} + 1\right)^2}{4\left(\frac{g_{m7}}{g_{m6}}\right)(g_{m6})}.$$

The added pole will still be at twice the frequency of the pole in the simple current mirror circuit of FIG. 1.

The present invention is not limited in the values of transistors and the resistor used. The trancondunctances of transistors Q6 and Q7 can be in any arbitrary ratio and the value of the equivalent resistance of resistor $R_{g6}$ can also be set to any arbitrary value in order to achieve any arbitrary desired frequency response of current mirror amplifier 10.

Figure 4:
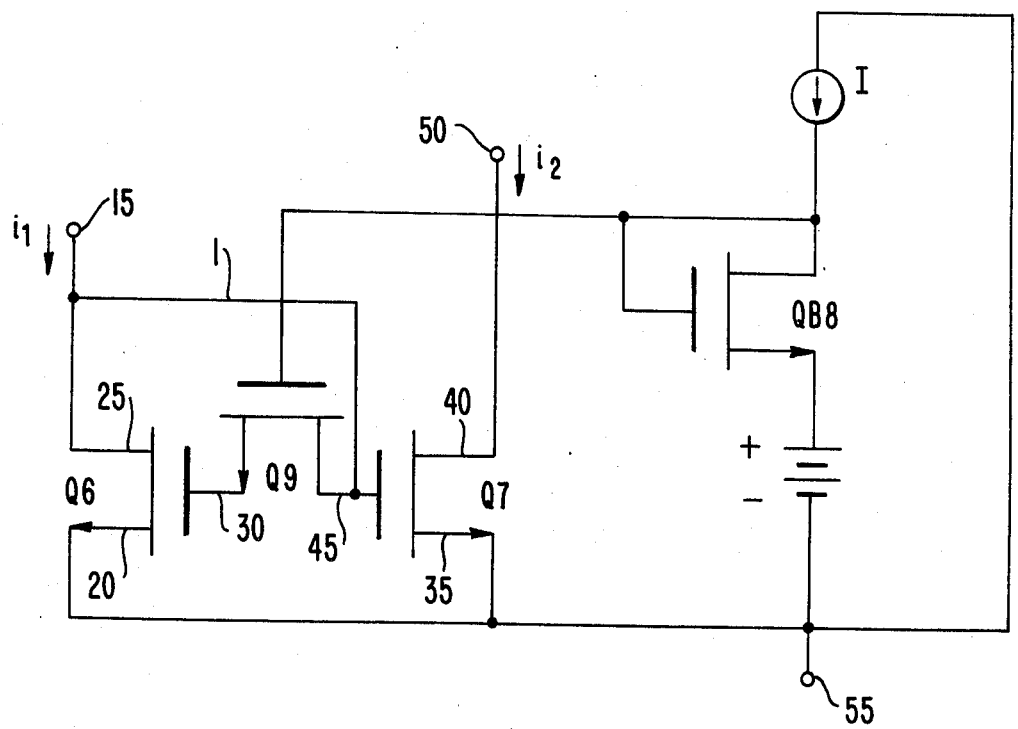
FIG. 4 is a schematic circuit diagram illustrating a current mirror circuit with added resistor realized by a tracking MOS device in accordance with preferred embodiment of the present invention.

The resistor $R_{g6}$ can be implemented as a tracking device as shown in FIG. 4. In this circuit, the required series resistance is generated by the drain-to-source impedence of device Q9, whose gate is biased by transistor QB8, the voltage source, and the current source, which are designed such that $r_{ds9} = 1/g_m$, where $g_m$ is the value required to adjust the CMA frequency response. When the biasing of one changes, the biasing of the other also changes, therefore, the transconductances also change equivalently. This tracking resistor technique is taught in the article entitled "A High Performance Low Power CMOS Channel Filter" by Black et al., IEEE Journal of Solid-State Circuits, Vol. SC-15, No. 6, December 1980.

As can be appreciated from the foregoing, this invention can be used to improve the frequency response of operational amplifiers when current mirror circuits are used as active loads, and of OTA's, which also use CMA's in the signal path. The invention reduces the degradation of the amplifier phase margin due to excess phase at the unity-gain frequency. The invention involves adjusting the mirror pole frequency. This is accomplished by modifying the feedback path around a diode-connected transistor in the current mirror circuit. The modification involves adding a resistor in series with the gate of the diode-connected device. When the invention is realized in MOS technology, a tracking MOS device may be used to realize the added resistor, in order to adjust the current mirror frequency response in a process-insensitive manner.

It will be apparent to those skilled in the art that various modifications and variations can be made to the current mirror amplifier of the present invention without departing from the spirit or scope of the invention. These include, but are not limited to, implementation of the invention in various IC technologies, or as discrete circuitry, in any technology, and implementation of the invention with devices of complementary types to those shown in the disclosure above. Thus, it is intended that the present invention cover the modifications and variations of the invention, provided they come within the scope of the appended claims and their equivalents.

What is claimed is:

1. A current mirror amplifier having an associated frequency response comprising:
   an input terminal for receiving an input current;
   first and second amplifying devices, each having an associated transconductance and a drain terminal, a source terminal, and a gate terminal, said drain terminal of said first amplifying device being connected to said input terminal of said current mirror amplifier, and said source terminal of said second amplifying device being connected to said source terminal of said first amplifying device.
   resistive means, having an associated value of equivalent resistance, connected between said gate terminals of said first and second amplifying devices for adjusting the frequency response of said current mirror amplifier;
   feedback means connected between said gate terminal of said second amplifying device and said input terminal of said current mirror amplifier for forcing said first amplifying device to accept said input current, and for simultaneously forcing said second amplifying device to accept an output current depending on said input current and the frequency response to said current mirror amplifier as determined by said resistive means; and
   an output terminal connected to said drain terminal of said second amplifying device for accepting an output current responsive to said input current.

2. The current mirror amplifier of claim 1, wherein:
   the transconductances of said first and second amplifying devices are equal; and
   the value of the equivalent resistance of said resistive means is the inverse of the transconductance of either said first or said second amplifying device.

3. The current mirror amplifier of claim 2, wherein said first and second amplifying devices are each field-effect transistors.

4. The current mirror amplifier of claim 3, wherein said resistive means is implemented as a tracking field-effect transistor.

5. The current mirror amplifier of claim 1, wherein the value of the equivalent resistance of said resistive means is:

$$(M+1)^2/4Mg_{m6}$$

where M is the ratio of the transconductance of said second amplifying device to the transconductance of said first amplifying device, and $g_{m6}$ is the transconductance of said first amplifying device.

6. The current mirror amplifier of claim 5, wherein said first and second amplifying devices are each field-effect transistors.

7. The current mirror amplifier of claim 6, wherein said resistive means is implemented as a tracking field-effect transistor.

8. The current mirror amplifier of claim 1, wherein the transconductances of said first and second amplifying devices are equal.

9. The current mirror amplifier of claim 8, wherein said first and second amplifying devices are each field-effect transistors.

10. The current mirror amplifier of claim 9, wherein said resistive means is implemented as a tracking field-effect transistor.

11. The current mirror amplifier of claim 1, wherein the transconductances of said first and second amplifying devices are not equal.

12. The current mirror amplifier of claim 11, wherein said first and second amplifying devices are each field-effect transistors.

13. The current mirror amplifier of claim 12, wherein said resistive means is implemented as a tracking field-effect transistor.

* * * * *